United States Patent
Park

(10) Patent No.: US 9,059,397 B2
(45) Date of Patent: Jun. 16, 2015

(54) NANO PIEZOELECTRIC DEVICE HAVING A NANOWIRE AND METHOD OF FORMING THE SAME

(75) Inventor: Jong-Hyurk Park, Daegu (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 351 days.

(21) Appl. No.: 13/563,773

(22) Filed: Aug. 1, 2012

(65) Prior Publication Data

US 2012/0306319 A1    Dec. 6, 2012

Related U.S. Application Data

(63) Continuation-in-part of application No. 12/544,694, filed on Aug. 20, 2009, now abandoned.

(30) Foreign Application Priority Data

Dec. 8, 2008 (KR) .................. 10-2008-0124014
Mar. 23, 2009 (KR) .................. 10-2009-0024626

(51) Int. Cl.
*H01L 41/04* (2006.01)
*H01L 41/113* (2006.01)
*H01L 41/316* (2013.01)
*B82Y 15/00* (2011.01)

(52) U.S. Cl.
CPC ............. *H01L 41/1136* (2013.01); *Y10T 29/42* (2015.01); *B82Y 15/00* (2013.01); *H01L 41/316* (2013.01)

(58) Field of Classification Search
USPC ........................................ 310/328
See application file for complete search history.

(56) References Cited

U.S. PATENT DOCUMENTS

| | | | |
|---|---|---|---|
| 6,559,550 B2 | 5/2003 | Herman | |
| 7,047,800 B2 | 5/2006 | Thiesen et al. | |
| 7,705,523 B2 | 4/2010 | Wang et al. | |
| 7,884,530 B2 | 2/2011 | Aizenberg et al. | |
| 7,936,111 B2 | 5/2011 | Choi et al. | |
| 7,936,112 B2 | 5/2011 | Choi et al. | |
| 7,982,370 B2 | 7/2011 | Wang et al. | |
| 7,999,446 B1 * | 8/2011 | Hsu et al. ............. | 310/339 |
| 8,022,601 B2 | 9/2011 | Stollberg | |

(Continued)

FOREIGN PATENT DOCUMENTS

| | | |
|---|---|---|
| JP | 2006-025593 A | 1/2006 |
| JP | 2007-184555 A | 7/2007 |
| JP | 2008-091549 A | 4/2008 |
| JP | 2009-521203 A | 5/2009 |
| KR | 100790524 A | 9/2007 |
| KR | 10-0809248 B1 | 2/2008 |

OTHER PUBLICATIONS

Qin, Yong et al., "Microfibre-nanowire hybrid structure for energy scavenging", Nature, vol. 451, pp. 809-814, Feb. 14, 2008.

(Continued)

*Primary Examiner* — J. San Martin
(74) *Attorney, Agent, or Firm* — Rabin & Berdo, P.C.

(57) ABSTRACT

Provided are a nano piezoelectric device and a method of forming the nano piezoelectric device. The nano piezoelectric device includes a lower electrode, a nanowire extending upward from the lower electrode, and an upper electrode on the nanowire. The nanowire includes a conductive wire core and a wire shell surrounding the wire core and including a piezoelectric material.

14 Claims, 8 Drawing Sheets

(56) References Cited

U.S. PATENT DOCUMENTS

| | | | |
|---|---|---|---|
| 8,039,834 B2 | 10/2011 | Wang et al. | |
| 8,283,739 B2 * | 10/2012 | Park et al. | 257/415 |
| 8,410,563 B2 * | 4/2013 | Park et al. | 257/415 |
| 8,661,635 B2 * | 3/2014 | Hsu et al. | 29/25.35 |
| 2002/0172820 A1 | 11/2002 | Majumdar et al. | |
| 2005/0009224 A1 | 1/2005 | Yang et al. | |
| 2007/0111368 A1 | 5/2007 | Zhang et al. | |
| 2008/0067618 A1 * | 3/2008 | Wang et al. | 257/415 |
| 2009/0085444 A1 | 4/2009 | Alvarez Icaza Rivera et al. | |
| 2013/0221806 A1 * | 8/2013 | Sohn et al. | 310/364 |

OTHER PUBLICATIONS

Wang, Zhaoyu et al., "Voltage Generation from Individual BaTiO3 Nanowires under Periodic Tensile Mechanical Load", Nano Letters, vol. 7, No. 10, pp. 2966-2969, 2007.

Xu, Shiyou et al., "Energy Harvesting From PZT Nanofibers", Materials Research Society, vol. 1034, 1034-K11-06, 2008.

Chen, Mi et al., "Low-Temperature Synthesis Multiwalled Carbon Nanotubes by Microwave Plasma Chemical Vapor Deposition Using CH4—CO2 Gas Mixture", The Japan Society of Applied Physics, vol. 42, pp. 614-619, Feb. 2003.

* cited by examiner

NANO PIEZOELECTRIC DEVICE HAVING A NANOWIRE AND METHOD OF FORMING THE SAME

CROSS-REFERENCE TO RELATED APPLICATIONS

This application is a Continuation-in-part of application Ser. No. 12/544,694, filed on Aug. 20, 2009. Furthermore, this application claims the benefit of priority of Korean applications 10-2008-0124014, filed Dec. 8, 2008, and 10-2009-0024626, filed on Mar. 23, 2009. The disclosures of these prior U.S. and Korean applications are incorporated herein by reference.

BACKGROUND OF THE INVENTION

The present invention disclosed herein relates to an energy-harvesting device and a method of forming the energy-harvesting device, and more particularly, to a nano piezoelectric device and a method of forming the nano piezoelectric device.

Piezoelectric devices use the piezoelectric principle to convert deformation induced by physical force to electrical energy. Such a piezoelectric device is configured with piezoelectric material disposed between an upper electrode and a lower electrode. When the piezoelectric material between the two electrodes is physically deformed, e.g. compressed, expanded, or bent, electricity is produced in proportion to the amount of the deformation, and the electricity is discharged through the electrodes, thereby harvesting energy.

Typical thick-film piezoelectric materials have a capacitor structure for using electricity generated in proportion to longitudinal deformation, such as compression and expansion between the surfaces of electrodes parallel to each other. Since the piezoelectric materials (which are in solid state) have a high Young's modulus, they are difficult to deform significantly. Thus, it is necessary to increase the surface area of the piezoelectric materials or stack the piezoelectric materials in a multi-layered structure to increase their electric generating capacity. In this case, an increase in electric generating capacity is accompanied by increases in volume and area of the piezoelectric materials. Thus, typical thick-film piezoelectric materials are difficult to miniaturize, and have low bending tolerance, which limit their practical application.

In recent years, R&D and application of technology using bulk or thick film structures, which is a typical energy-harvesting device technology that employs the piezoelectric effect, have been implemented. Lead zirconate titanate (PZT) or crystalline lead magnesium niobate-lead titanate (PMN-PT) ($Pb(Mg_{1/3}Nb_{2/3}O_3$-30% $PbTiO_3$) is used as a typical bulk or thick-film material. Although these typical bulk or thick-film materials have excellent piezoelectric characteristics, their future applications are limited by their high sintering temperatures of about 600° C. or more, and because the crystalline material is expensive and contains toxic material such as lead. In addition, these materials have limitations in that they cannot be applied to future portable devices or terminals for ubiquitous services that must be miniaturized and lightweight and to plastic substrates.

SUMMARY OF THE INVENTION

The present invention provides a nano piezoelectric device having improved mechanical and electrical characteristics.

Embodiments of the present invention provide nano piezoelectric devices including: a lower electrode; a nanowire extending upward from the lower electrode; and an upper electrode on the nanowire, wherein the nanowire includes a conductive wire core and a wire shell surrounding the wire core and including a piezoelectric material.

In some embodiments, the wire core may include one of a carbon nanotube, a wire of pure metals or alloys like tungsten, nickel and carbon steel.

In other embodiments, the wire shell may include one of zinc oxide, aluminum nitride, barium titanite($BaTiO_3$), strontium titanite($SrTiO_3$), or polyvinylidene fluoride(PVDF).

In still other embodiments, charge generated from the wire shell may be discharged to the upper electrode and the lower electrode through the wire core.

In even other embodiments, the upper electrode may be in contact with the nanowire.

In yet other embodiments, the upper electrode may be spaced apart from the nanowire.

In further embodiments, the nano piezoelectric devices may further include a deformation auxiliary pattern disposed in a space between the upper electrode and the nanowire, and a physical force applied to the upper electrode may deform the nanowire through the deformation auxiliary pattern.

In still further embodiments, the nano piezoelectric devices may further include a structure support part on the lower electrode, and the structure support part may surround a lower portion of the nanowire.

In other embodiments of the present invention, methods of forming a nano piezoelectric device include: vertically growing a plurality of wire cores from a lower electrode; forming a plurality of wire shells respectively surrounding the wire cores and including a piezoelectric material; and forming an upper electrode on a plurality of nanowires each including the wire core and the wire shell.

In some embodiments, the wire core may include a carbon nanotube.

In other embodiments, the growing of the wire cores including the carbon nanotubes may include: forming a dielectric on the lower electrode; patterning the dielectric to form a plurality of growth holes; and forming a metal catalyst for the carbon nanotubes, in the growth holes.

In still other embodiments, the forming of the wire shells may include performing an electro-plating process to form a seed layer selectively on the carbon nanotube.

In even other embodiments, the forming of the wire shells may include: forming a dielectric on the lower electrode; performing a sputtering process to form a seed layer on the carbon nanotube and the dielectric; and performing a lift-off process on the dielectric to selectively remove the seed layer on the dielectric.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
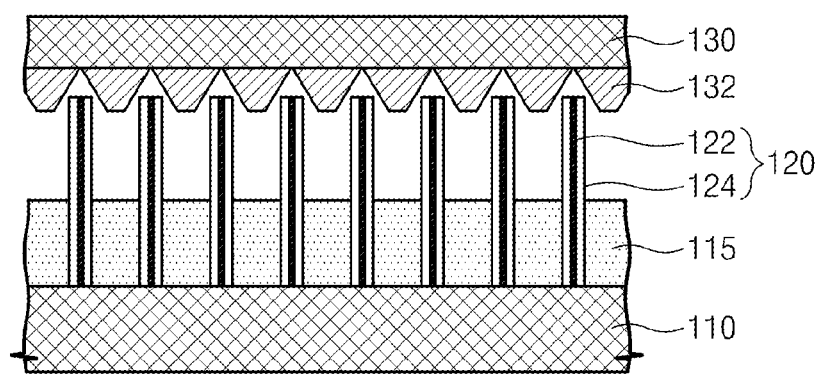
FIG. 1 is a schematic view illustrating a nano piezoelectric device according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. Like reference numerals refer to like elements throughout.

Hereinafter, it will be described about exemplary embodiments of the present invention in conjunction with the accompanying drawings.

FIG. 1 is a schematic view illustrating a nano piezoelectric device according to an embodiment of the present invention.

Referring to FIG. 1, a plurality of nanowires 120 are disposed on a lower electrode 110. Each of the nanowires 120 includes a conductive wire core 122 and a wire shell 124 including a piezoelectric material. The wire shell 124 surrounds the wire core 122. An upper electrode 130 is disposed on the nanowires 120. The nanowires 120 may have a length ranging from about 1 μm to about 10 μm and a width or diameter ranging from about 50 nm to about 300 nm.

The lower electrode 110 may include a semiconductor substrate, a plastic substrate, or a glass substrate. The plastic substrate or the glass substrate may be patterned through a photolithography process. When the lower electrode 110 includes the plastic substrate, the flexibility of the nano piezoelectric device is secured to be easily applied to future high-tech fields.

The wire shell 124 includes a piezoelectric material that may be a nanowire including zinc oxide. Alternatively, the piezoelectric material may include any material exhibiting a piezoelectric characteristic, e.g., lead zirconate titanate (PZT), $BaTiO_3$, GaN, aluminum nitride, strontium titanite ($SrTiO_3$), or polyvinylidene fluoride(PVDF). The wire shell 124, having a one-dimensional structure, may be susceptible to deformation due to a physical force.

The wire core 122 may include a carbon nanotube that has high mechanical strength and electrical conductivity. Alternatively, the wire core 122 may include a wire of pure metal or alloys thereof, for example tungsten, nickel and carbon steel. Thus, although the wire shell 124 has poor mechanical strength, the mechanical strength of the nanowire 120 is improved by the wire core 122. Also, although the wire shell 124 has poor electrical conductivity, the electrical conductivity of the nanowire 120 is improved by the wire core 122, and electricity generated by a piezoelectric effect is efficiently discharged.

The carbon nanotube may be a single-wall carbon nanotube (SWCNT) or a multi-wall carbon nanotube (MWCNT). The single-wall carbon nanotube may have a diameter of about 3 nm or less, and the multi-wall carbon nanotube may have a diameter of about 10 nm or less.

Due to a work function difference, a Schottky contact may be between a ZnO nanowire and a CNT core to adjust a flow of charges generated at the ZnO nanowire through the CNT core according to their polarities. A work function of the ZnO nanowire is about 4.52 eV. In case of an MWCNT, a work function of about 5 eV or more may be obtained through acid treatment or plasma. As the diameter of an SWCNT decreases, a work function thereof increases. Because the SWCNT having semiconductor characteristics has p-type characteristics, the SWCNT and the ZnO nanowire having n-type characteristics form a p-n diode junction. In this case, when charges corresponding to a forward bias are generated at n-side ZnO nanowire, current flows through a p-side SWCNT core while charges corresponding to a reverse bias cannot flow therethrough. Thus, simple rectification may be accomplished.

A double-electrode structure may be applied as another shape. The double-electrode structure includes a core electrode inside a ZnO nanowire and a shell electrode outside the ZnO nanowire. If a material having a greater work function than the ZnO nanowire is disposed at the core electrode and a material having a smaller work function than the ZnO nanowire is disposed at the shell electrode, charges generated at the ZnO nanowire are divided according to their polarities to flow to the core electrode and the shell electrode. Thus, more improved rectification characteristics and efficiency may be achieved.

In addition, if a layer of dielectric material (e.g., $Al_2O_3$, which may be grown at a low temperature such as an atomic layer deposition (ALD) process) having a very small thickness (e.g. 5 nm or less) is formed between the CNT core and the ZnO nanowire, electrically and mechanically more reliable rectification characteristics may be implemented. Thus, it may be expected that reliability and lifetime of a device will be improved.

According to another embodiment of the present invention, the wire core 122 may include a carbon nanofiber. In this case, the wire core 122 including the carbon nanofiber is similar to a wire core including a carbon nanotube in mechanical and electrical performances.

The upper electrode 130 may include a conductive material, e.g., a metal. Alternatively, the upper electrode 130 may include a conductive oxide or organic material. The upper electrode 130 may be spaced apart from the nanowires 120. Deformation auxiliary patterns 132 may be disposed in the space between the nanowires 120 and the upper electrode 130. Particularly, the deformation auxiliary patterns 132 may be attached to a bottom surface of the upper electrode 130. The deformation auxiliary patterns 132 may have a structure adapted for deforming the nanowires 120. The structure of the deformation auxiliary patterns 132 will be described later.

A structure support part 115 may be disposed on the lower electrode 110. The structure support part 115 may surround lower portions of the nanowires 120. The structure support part 115 may include an insulating polymer or porous material for the free deformation of its surrounding space.

The structure support part 115 improves the structural stability of the nanowires 120 against the deformation. That is, when the nanowires 120 are deformed by a physical force, the structure support part 115 prevents the excessive deformation of the nanowires 120. Alternatively, after the nanowires 120 are deformed by a physical force, the structure support part 115 easily restores the nanowires 120 to their original positions.

According to the current embodiment of the present invention, the nanowire 120 has a multi-structure including the wire shell 124 and the wire core 122. Since the nanowire 120 has a one-dimensional structure, the deformation per unit volume of the nanowire 120 is maximized. Thus, the nanowire 120 is deformed in the even greater range than a bulk structure, and a generating efficiency of the nanowire 120 is more easily improved than the bulk structure. Also, the wire core 122 improves the mechanical strength and the electrical conductivity of the nanowire 120. Thus, the piezoelectric characteristic, the mechanical strength, and the electrical conductivity of the nanowires 120 having a multi-structure are all improved.

Figure 2:
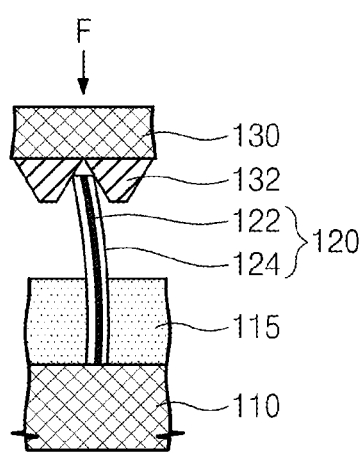
FIG. 2 is a schematic view illustrating deformation of a nano piezoelectric device according to an embodiment of the present invention.

FIG. 2 is a schematic view illustrating deformation of the nano piezoelectric device according to an embodiment of the present invention.

Referring to FIG. 2, a physical force F applied to the upper electrode 130 may deform the nanowire 120 on the lower electrode 110. The nanowire 120 is bent, compressed, or elongated to generate charge. That is, an external mechanical deformation causes an electrical polarization in the wire shell 124 formed of a piezoelectric material. Although the bending of the nanowire 120 is exemplified in FIG. 2, the nanowire 120 may be compressed or elongated in its longitudinal direction to cause the electrical polarization.

The upper electrode 130 may be spaced apart from the nanowires 120 as illustrated in FIG. 1. The physical force F may deform the nanowires 120 through the upper electrode 130. The deformation auxiliary patterns 132 may be disposed between the upper electrode 130 and the nanowires 120. Variation may be made on the shape of the deformation auxiliary patterns 132 to easily deform the nanowires 120. Charge generated by the physical force F may be discharged to the upper electrode 130 and the lower electrode 110 through the conductive wire core 122.

The upper electrode 130 and the lower electrode 110 are connected to a rectifier circuit to output a predetermined polarity. Alternatively, the nanowire 120 is deformed within a predetermined period, a current generated from the nanowire 120 may be output in the form of an alternating current. Since the nanowire 120 is easily deformed, the nanowire 120 responds to a stress due to ambient vibration having a high frequency (about 100 Hz or more), and thus a generating efficiency per unit time is improved.

Figure 3:
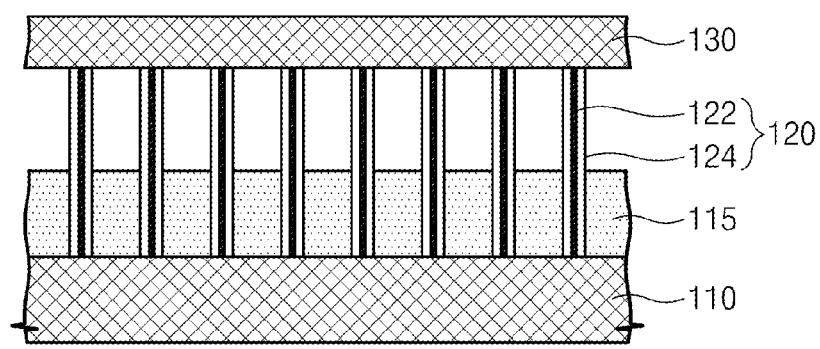
FIG. 3 is a schematic view illustrating a nano piezoelectric device according to another embodiment of the present invention.

FIG. 3 is a schematic view illustrating a nano piezoelectric device according to another embodiment of the present invention.

Referring to FIG. 3, the nanowires 120 are disposed on the lower electrode 110. Each of the nanowires 120 includes the conductive wire core 122 and the wire shell 124 including a piezoelectric material. The wire shell 124 surrounds the wire core 122. The upper electrode 130 is disposed on the nanowires 120. The nanowires 120 may have a length ranging from about 1 μm to about 10 μm, and a width or diameter ranging from about 50 nm to about 300 nm.

The lower electrode 110 may include a semiconductor substrate, a plastic substrate, or a glass substrate. The plastic substrate or the glass substrate may be patterned through a photolithography process. When the lower electrode 110 includes the plastic substrate, the flexibility of the nano piezoelectric device is secured to be easily applied to future high-tech fields.

The wire shell 124 includes a piezoelectric material that may be a nanowire including zinc oxide. Alternatively, the piezoelectric material may include any material exhibiting a piezoelectric characteristic, e.g., lead zirconate titanate (PZT), $BaTiO_3$, GaN, aluminum nitride, strontium titanite ($SrTiO_3$), or polyvinylidene fluoride(PVDF). The wire shell 124, having a one-dimensional structure, may be susceptible to deformation due to a physical deformation.

The wire core 122 may include a carbon nanotube that has high mechanical strength and electrical conductivity. Alternatively, the wire core 122 may include a wire of pure metal or alloys thereof, for example tungsten, nickel and carbon steel. Thus, although the wire shell 124 has poor mechanical strength, the mechanical strength of the nanowire 120 is improved by the wire core 122. Also, although the wire shell 124 has poor electrical conductivity, the electrical conductivity of the nanowire 120 is improved by the wire core 122, and electricity generated by a piezoelectric effect is efficiently discharged.

The carbon nanotube may be a single-wall carbon nanotube (SWCNT) or a multi-wall carbon nanotube (MWCNT). The single-wall carbon nanotube may have a diameter of about 3 nm or less, and the multi-wall carbon nanotube may have a diameter of about 10 nm or less.

According to another embodiment of the present invention, the wire core 122 may include a carbon nanofiber. In this case, the wire core including the carbon nanofiber is similar to a wire core including a carbon nanotube in mechanical and electrical performances.

The upper electrode 130 may include a conductive material, e.g., a metal. Alternatively, the upper electrode 130 may include a conductive oxide or organic material.

According to the current embodiment of the present invention, the upper electrode 130 may be in contact with the nanowires 120, and the deformation auxiliary patterns 132 may be omitted. A physical force applied to the upper electrode 130 is transmitted directly to the nanowire 120 to bend or compress the nanowire 120. According to another embodiment of the present invention, the deformation auxiliary patterns 132 illustrated in FIG. 1 may be disposed between the upper electrode 130 and the nanowires 120. In this case, the deformation auxiliary patterns 132 may be in contact with the nanowires 120.

The structure support part 115 may be disposed on the lower electrode 110. The structure support part 115 may surround the lower portions of the nanowires 120. The structure support part 115 may include an insulating polymer or porous material for the free deformation of its surrounding space.

The structure support part 115 improves the structural stability of the nanowires 120 against the deformation. That is, when the nanowires 120 are deformed by a physical force, the structure support part 115 prevents the excessive deformation of the nanowires 120. Alternatively, after the nanowires 120 are deformed by a physical force, the structure support part 115 easily restores the nanowires 120 to their original positions.

According to the current embodiment of the present invention, the nanowire 120 has a multi-structure including the wire shell 124 and the wire core 122. Since the nanowire 120 has a one-dimensional structure, the deformation per unit volume of the nanowire 120 is maximized. Thus, the nanowire 120 is deformed in the even greater range than a bulk structure, and the generating efficiency of the nanowire 120 is more easily improved than the bulk structure. Also, the wire core 122 improves the mechanical strength and the electrical conductivity of the nanowire 120. Thus, the piezoelectric characteristic, the mechanical strength, and the electrical conductivity of the nanowires 120 having a multi-structure are all improved.

Figure 4:
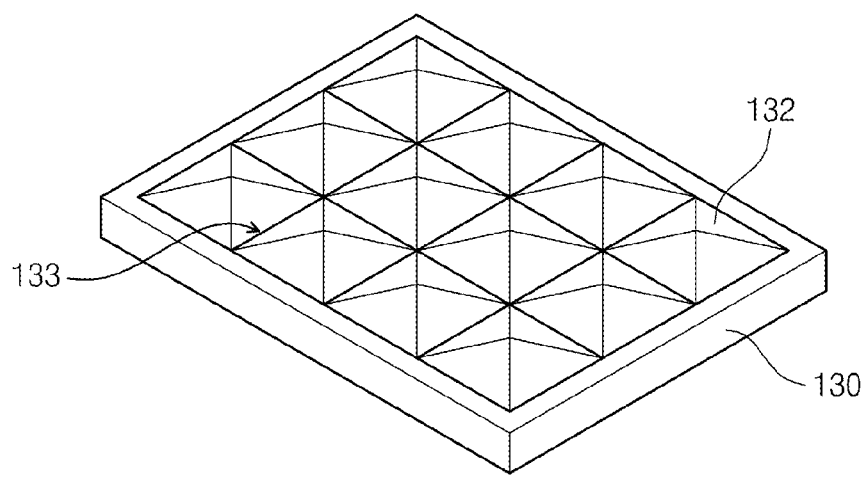
FIGS. 4 and 5 are schematic views illustrating deformation auxiliary patterns according to an embodiment of the present invention.
Figure 5:
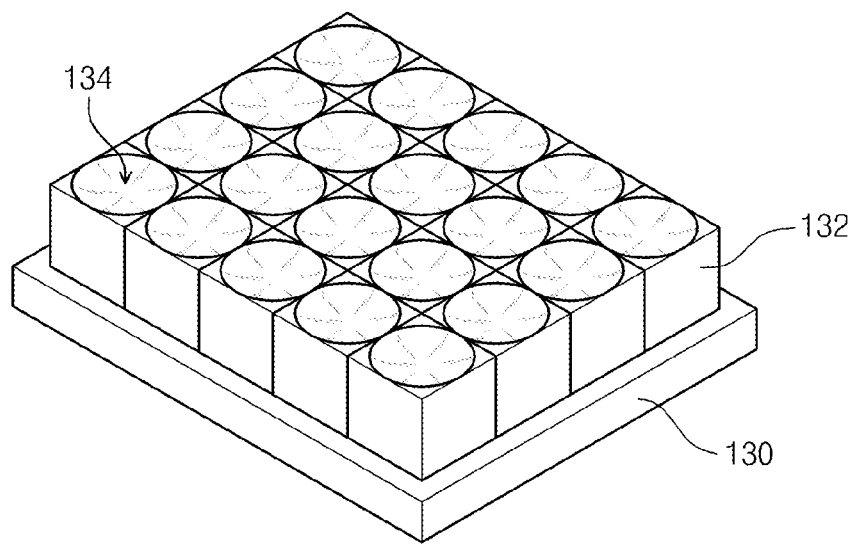

FIGS. 4 and 5 are schematic views illustrating the deformation auxiliary patterns 132 according to an embodiment of the present invention.

Referring to FIGS. 4 and 5, the deformation auxiliary patterns 132 attached to the upper electrode 130 may have one of various shapes. The deformation auxiliary patterns 132 may have a pyramid shape as illustrated in FIG. 4. The pyramid-shaped deformation auxiliary patterns 132 may have recess regions 133 between the apexes of pyramids. Alternatively, as illustrated in FIG. 5, the deformation auxiliary patterns 132 may have a cylindrical shape or an elongated oval shape that may include concave regions 134.

The nanowires 120 are easily deformed through the recess regions 133 or the concave regions 134 of the deformation auxiliary patterns 132. That is, the nanowires 120 are bent or compressed along the surfaces of the recess regions 133 or the concave regions 134. The shapes of the deformation auxiliary patterns 132 are not limited to the shapes as illustrated in FIGS. 4 and 5.

FIGS. 6A through 6E are schematic views illustrating a method of forming a nano piezoelectric device according to an embodiment of the present invention.

Figure 6A:
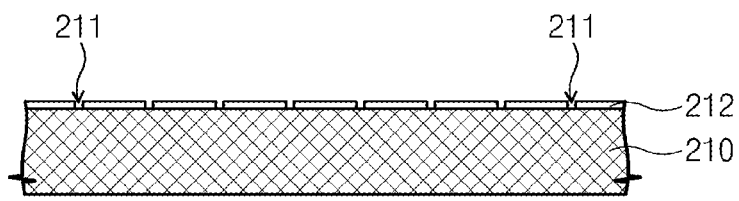
FIGS. 6A through 6E are schematic views illustrating a method of forming a nano piezoelectric device according to an embodiment of the present invention.

Referring to FIG. 6A, a dielectric 212 is formed on a lower electrode 210. The dielectric 212 may include a polymer or an oxide. The lower electrode 210 may include a semiconductor substrate, a plastic substrate, or a glass substrate. The dielectric 212 is patterned to form growth holes 211 in the dielectric 212. The dielectric 212 may be patterned through a photolithography process. The growth holes 211 may define regions where nanowires are formed.

Figure 6B:
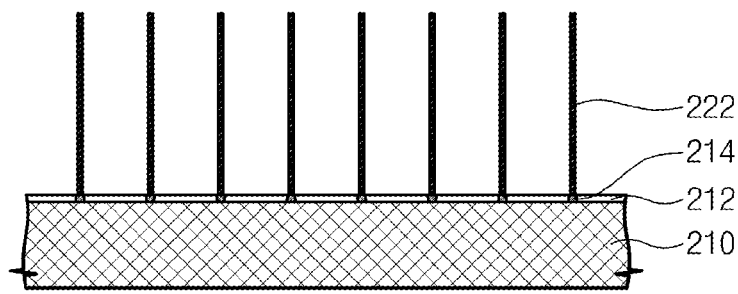

Referring to FIG. 6B, a metal catalyst 214 filling the growth holes 211 is formed. The metal catalyst 214 may include iron (Fe) or cobalt (Co). Wire cores 222 are formed according to a vapor deposition method of supplying $C_nH_m$ (e.g., $CH_4$) gas to the metal catalyst 214. The wire cores 222 may be carbon nanotubes. The carbon nanotube may be a single-wall carbon nanotube (SWCNT) or a multi-wall carbon nanotube (MWCNT). The single-wall carbon nanotube may have a diameter of about 3 nm or less, and the multi-wall carbon nanotube may have a diameter of about 10 nm or less.

A process of growing the carbon nanotubes according to the vapor deposition method will now be described. When the $C_nH_m$ gas is supplied to the metal catalyst 214, the $C_nH_m$ gas experiences dissolution and decomposition processes by the metal catalyst 214 to produce carbon and hydrogen. The carbon, produced from the $C_nH_m$ gas and deposited on the metal catalyst 214, forms a core through forming fullerene. Thereafter, the carbon is continuously supplied to grow the carbon nanotubes.

Figure 6C:
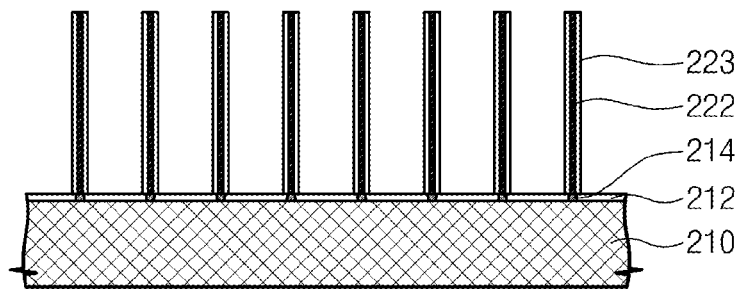

Referring to FIG. 6C, seed layers 223 are formed on the surfaces of the wire cores 222. The seed layers 223 are selectively formed on the wire cores 222 through an electro-plating process. Since the wire cores 222 are conductive, when a voltage is applied to the lower electrode 210, the seed layers 223 are selectively formed on the wire cores 222.

Figure 6D:
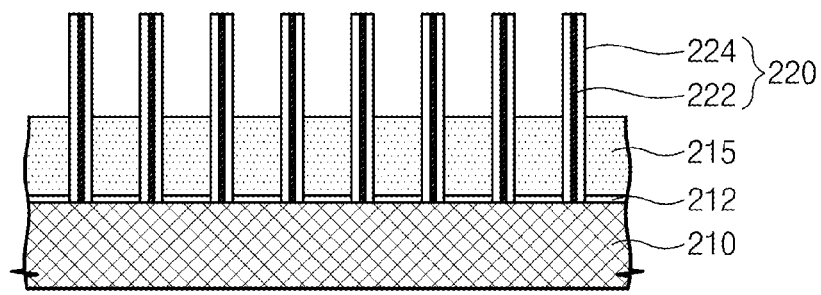

Referring to FIG. 6D, wire shells 224 including a piezoelectric material and surrounding the wire cores 222 are formed. The wire shells 224 may include zinc oxide. Alternatively, the wire shells 224 may include any material exhibiting a piezoelectric characteristic, e.g., lead zirconate titanate (PZT), $BaTiO_3$, or GaN.

In the case where the wire shells 224 include zinc oxide, the seed layers 223 may include zinc. The wire shells 224 may be formed from the seed layers 223 with a solution containing zinc salt. A solution, growing the zinc oxide of the wire shells 224, is methanol containing KOH or NaOH with zinc acetate hydrate having a concentration ranging from about 0.01 M to about 1 M. Alternatively, a solution, growing the zinc oxide of the wire shells 224, is a uniform aqueous solution containing hexamethylenetetramine with zinc acetate hydrate. A sol-gel stabilizer, such as ethanolamine, may be added to the solution. At this point, a growth temperature of the zinc oxide may be adjusted between a room temperature and about 100° C., and a growth time thereof may be several hours according to the growth temperature and the concentration of components in the solution, and the ratio of the width of the wire shell 224 to its length may be adjusted. Accordingly, nanowires 220 including the wire cores 222 and the wire shells 224 are formed.

A structure support part 215 may be formed on the dielectric 212. The structure support part 215 may surround lower portions of the nanowires 220. The structure support part 215 may include an insulating polymer or porous material for the free deformation of its surrounding space.

The structure support part 215 improves the structural stability of the nanowires 220 against the deformation. That is, when the nanowires 220 are deformed by a physical force, the structure support part 215 prevents the excessive deformation of the nanowires 220. Alternatively, after the nanowires 220 are deformed by a physical force, the structure support part 215 easily restores the nanowires 220 to their original positions.

Figure 6E:
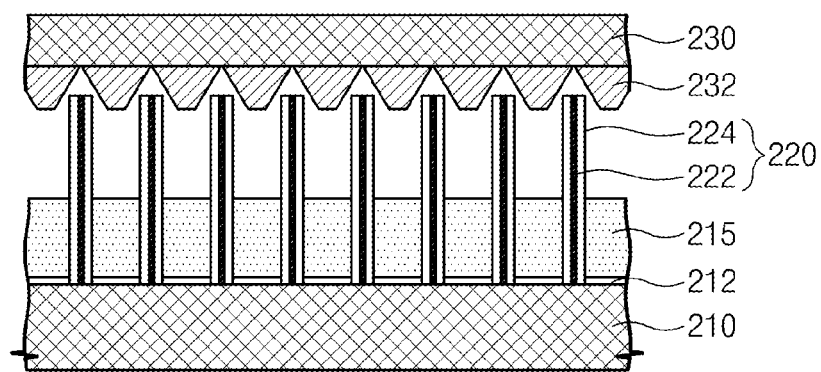

Referring to FIG. 6E, an upper electrode 230 is formed on the nanowires 220. The upper electrode 230 may include a conductive material, e.g., a metal. Alternatively, the upper electrode 230 may include a conductive oxide or organic material. The upper electrode 230 may be spaced apart from the nanowires 220. Deformation auxiliary patterns 232 may be formed in the space between the nanowires 220 and the upper electrode 230. Particularly, the deformation auxiliary patterns 232 may be attached to a bottom surface of the upper electrode 230. The deformation auxiliary patterns 232 may have a structure adapted for deforming the nanowires 220.

According to the current embodiment of the present invention, the nanowire 220 has a multi-structure including the wire shell 224 and the wire core 222. Since the multi-structured nanowire 220 has a one-dimensional structure, the deformation per unit volume of the nanowire 220 is maximized. Thus, the nanowire 220 is deformed in the even greater range than a bulk structure, and the generating efficiency of the nanowire 220 is more easily improved than the bulk structure. Also, the wire core 222 improves the mechanical strength and the electrical conductivity of the nanowire 220. Thus, the piezoelectric characteristic, the mechanical strength, and the electrical conductivity of the nanowires 220 having a multi-structure are all improved.

FIGS. 7A through 7F are schematic views illustrating a method of forming a nano piezoelectric device according to another embodiment of the present invention.

Figure 7A:
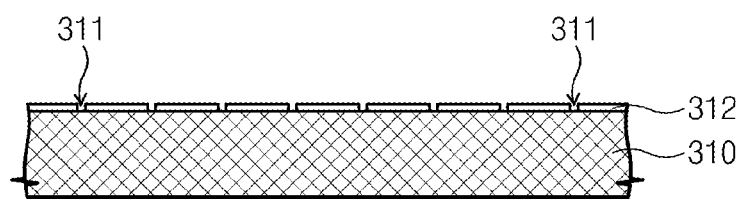
FIGS. 7A through 7F are schematic views illustrating a method of forming a nano piezoelectric device according to another embodiment of the present invention.

Referring to FIG. 7A, a dielectric 312 is formed on a lower electrode 310. The dielectric 312 may include a polymer or an oxide. The lower electrode 310 may include a semiconductor substrate, a plastic substrate, or a glass substrate. The dielectric 312 is patterned to form growth holes 311 in the dielectric 312. The dielectric 312 may be patterned through a photolithography process. The growth holes 311 may define regions where nanowires are formed.

Figure 7B:
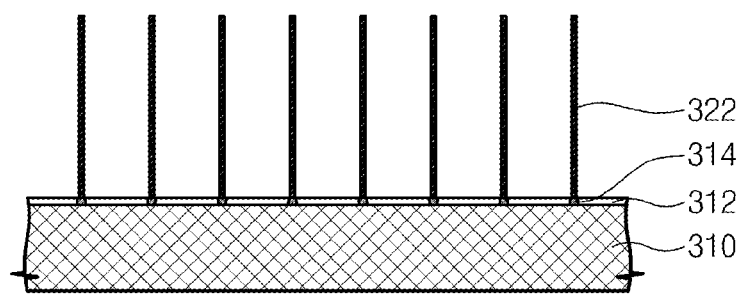

Referring to FIG. 7B, a metal catalyst 314 is formed in the growth holes 311. The metal catalyst 314 may include iron (Fe) or cobalt (Co). Wire cores 322 are formed according to a vapor deposition method of supplying $C_nH_m$ (e.g., $CH_4$) gas to the metal catalyst 314. The wire cores 322 may be carbon nanotubes. The carbon nanotube may be a single-wall carbon nanotube (SWCNT) or a multi-wall carbon nanotube (MWCNT). The single-wall carbon nanotube may have a diameter of about 3 nm or less, and the multi-wall carbon nanotube may have a diameter of about 10 nm or less.

A process of growing the carbon nanotubes according to the vapor deposition method will now be described. When the $C_nH_m$ gas is supplied to the metal catalyst 314, the $C_nH_m$ gas experiences dissolution and decomposition processes by the metal catalyst 314 to produce carbon and hydrogen. The carbon, produced from the $C_nH_m$ gas and deposited on the metal catalyst 314 forms a core through forming fullerene. Thereafter, the carbon is continuously supplied to grow the carbon nanotubes.

Figure 7C:
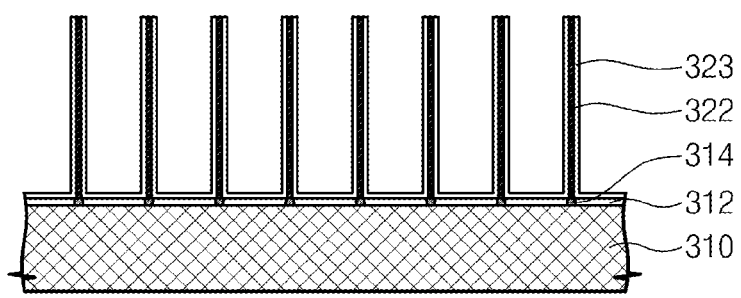

Referring to FIG. 7C, a seed layer 323 is formed on the surfaces of the wire cores 322. The seed layer 323 may be formed on the wire cores 322 and the dielectric 312 through a sputtering process.

Figure 7D:
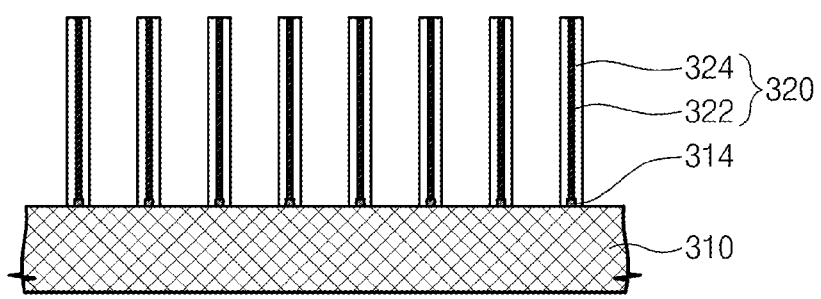

Referring to FIG. 7D, a lift-off process may be performed on the dielectric 312 to selectively remove the seed layer 323 from the dielectric 312. Then, wire shells 324 are formed, surrounding the wire cores 322 and including a piezoelectric material. The wire shells 324 may include zinc oxide. Alternatively, the wire shell 324 may include a material exhibiting a piezoelectric characteristic, e.g., lead zirconate titanate (PZT), $BaTiO_3$, or GaN.

In the case where the wire shells 324 include zinc oxide, the seed layer 323 may include zinc. The wire shells 324 may be formed from the seed layer 323 with a solution containing zinc salt. A solution, growing the zinc oxide of the wire shells 324, is methanol containing KOH or NaOH with zinc acetate hydrate having a concentration ranging from about 0.01 M to about 1 M. Alternatively, a solution, growing the zinc oxide of the wire shells 324, is a uniform aqueous solution containing hexamethylenetetramine with zinc acetate hydrate. A sol-gel stabilizer, such as ethanolamine, may be added to the solution. At this point, a growth temperature of the zinc oxide may be adjusted between a room temperature and about 100° C., and a growth time thereof may be several hours according to the growth temperature and the concentration of components in the solution, and the ratio of the width of the wire shell 324 to its length may be adjusted. Accordingly, nanowires 320 including the wire cores 322 and the wire shells 324 are formed.

Figure 7E:
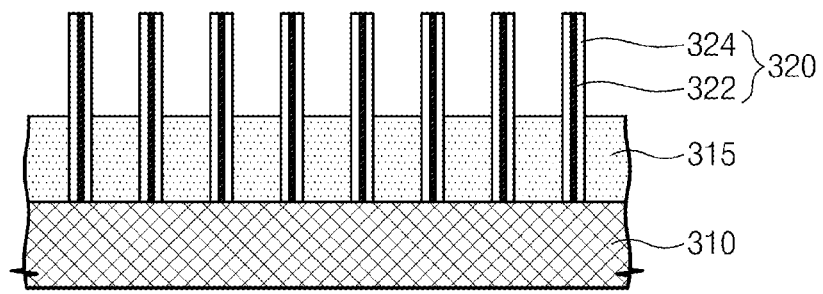

Referring to FIG. 7E, a structure support part 315 may be formed on the lower electrode 310. The structure support part 315 may surround lower portions of the nanowires 320. The structure support part 315 may include an insulating polymer or porous material for the free deformation of its surrounding space.

The structure support part 315 improves the structural stability of the nanowires 320 against the deformation. That is, when the nanowires 320 are deformed by a physical force, the structure support part 315 prevents the excessive deformation of the nanowires 320. Alternatively, after the nanowires 320 are deformed by a physical force, the structure support part 315 easily restores the nanowires 320 to their original positions.

Figure 7F:
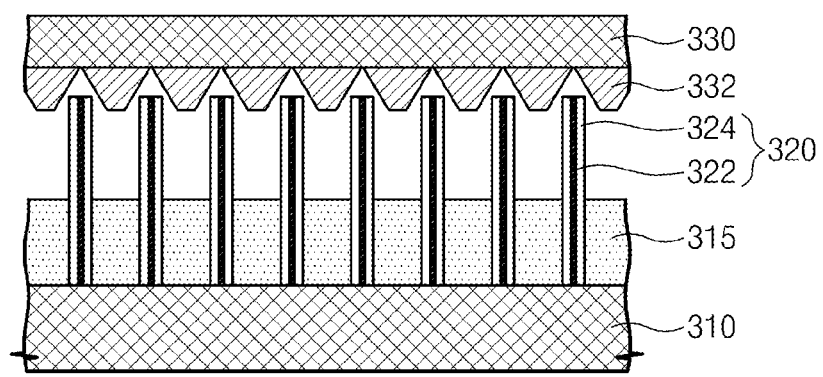

Referring to FIG. 7F, an upper electrode 330 is formed on the nanowires 320. The upper electrode 330 may include a conductive material, e.g., a metal. Alternatively, the upper electrode 330 may include a conductive oxide or organic material. The upper electrode 330 may be spaced apart from the nanowires 320. Deformation auxiliary patterns 332 may be formed in the space between the nanowires 320 and the upper electrode 330. Particularly, the deformation auxiliary patterns 332 may be attached to a bottom surface of the upper electrode 330. The deformation auxiliary patterns 332 may have a structure adapted for deforming the nanowires 320.

According to the current embodiment of the present invention, the nanowire 320 has a multi-structure including the wire shell 324 and the wire core 322. Since the multi-structured nanowire 320 has a one-dimensional structure, the deformation per unit volume of the nanowire 320 is maximized. Thus, the nanowire 320 is deformed in the even greater range than a bulk structure, and the generating efficiency of the nanowire 320 is more easily improved than the bulk structure. Also, the wire core 322 improves the mechanical strength and the electrical conductivity of the nanowire 320. Thus, the piezoelectric characteristic, the mechanical strength, and the electrical conductivity of the nanowires 320 having a multi-structure are all improved.

According to the embodiment of the present invention, the nanowire has a multi-structure including the wire shell and the wire core. Since the multi-structured nanowire has a one-dimensional structure, the deformation per unit volume of the nanowire is maximized. Thus, the nanowire can be deformed in the even greater range than a bulk structure, and the generating efficiency of the nanowire 320 is more easily improved than the bulk structure. Also, the wire core improves the mechanical strength and the electrical conductivity of the nanowire. Thus, the piezoelectric characteristic, the mechanical strength, and the electrical conductivity of the nanowires having a multi-structure are all improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A nano piezoelectric device comprising:
a lower electrode;
a nanowire extending upward from the lower electrode; and
an upper electrode on the nanowire;
wherein the nanowire includes a conductive wire core and a wire shell surrounding the wire core and including a piezoelectric material; and
wherein the conductive wire core and the wire shell have a PN diode junction connected from the lower electrode to the upper electrode, respectively, not forming a Schottky contact between the nanowire and the upper electrode.

2. The nano piezoelectric device of claim 1, wherein the wire core includes a carbon nanotube.

3. The nano piezoelectric device of claim 1, wherein the wire core includes one of tungsten, nickel, carbon steel or an alloy thereof.

4. The nano piezoelectric device of claim 1, wherein the wire shell includes zinc oxide connected to the upper electrode.

5. The nano piezoelectric device of claim 1, wherein the wire shell includes one of aluminum nitride, barium titanite ($BaTiO_3$), strontium titanite($SrTiO_3$), or polyvinylidene fluoride(PVDF).

6. The nano piezoelectric device of claim 1, wherein charge generated from the wire shell is discharged to the upper electrode and the lower electrode through the wire core.

7. The nano piezoelectric device of claim 1, wherein the upper electrode is in contact with the nanowire.

8. The nano piezoelectric device of claim 1, wherein the upper electrode is spaced apart from the nanowire.

9. The nano piezoelectric device of claim 8, further comprising a deformation auxiliary pattern disposed in a space between the upper electrode and the nanowire;

wherein a physical force applied to the upper electrode deforms the nanowire through the deformation auxiliary pattern.

10. The nano piezoelectric device of claim 1, further comprising a structure support part on the lower electrode;

wherein the structure support part surrounds a lower portion of the nanowire.

11. The nano piezoelectric device of claim 1, wherein the nanowire has a length of between about 1 μm and about 10 μm, and a width or diameter of between about 50 nm and about 300 nm.

12. The nano piezoelectric device of claim 1, wherein the wire core includes a single-wall carbon nanotube or a multi-wall carbon nanotube.

13. The nano piezoelectric device of claim 10, wherein the structure support part is configured to restore the nanowire to an original position after deformation.

14. A nano piezoelectric device comprising:

a lower electrode;

a nanowire extending upward from the lower electrode; and an upper electrode disposed on the nanowire, the upper electrode including metal;

wherein the nanowire includes a conductive wire core and a wire shell surrounding the wire core and including a piezoelectric material connected to the upper electrode; and wherein the conductive wire core includes one of tungsten, nickel, carbon steel or an alloy thereof, not forming a Schottky contact between the nanowire and the upper electrode.

* * * * *